United States Patent
Yin et al.

(10) Patent No.: US 12,389,762 B2
(45) Date of Patent: Aug. 12, 2025

(54) ORGANIC LIGHT-EMITTING DIODE (OLED) DISPLAY PANEL WITH SHIELDING LAYER ABSORBING NOISE ON SCANNING SIGNAL LINES

(71) Applicant: BOE Technology Group Co., Ltd., Beijing (CN)

(72) Inventors: Xinshe Yin, Beijing (CN); Tian Dong, Beijing (CN); Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 662 days.

(21) Appl. No.: 17/638,983

(22) PCT Filed: Jan. 22, 2021

(86) PCT No.: PCT/CN2021/073397
§ 371 (c)(1),
(2) Date: Feb. 28, 2022

(87) PCT Pub. No.: WO2021/164493
PCT Pub. Date: Aug. 26, 2021

(65) Prior Publication Data
US 2022/0271114 A1 Aug. 25, 2022

(30) Foreign Application Priority Data
Feb. 17, 2020 (CN) .......................... 202010095983.7

(51) Int. Cl.
*H10K 59/126* (2023.01)
*H10K 50/86* (2023.01)
(Continued)

(52) U.S. Cl.
CPC ......... *H10K 59/126* (2023.02); *H10K 50/865* (2023.02); *H10K 59/131* (2023.02); *H10K 2102/3026* (2023.02)

(58) Field of Classification Search
CPC .......... G09G 3/30; G09G 3/32; G09G 3/3208; G09G 3/3216; G09G 3/3225;
(Continued)

(56) References Cited

U.S. PATENT DOCUMENTS 12,159,577 B2 *  12/2024  Liu ...................... H10D 86/441
12,243,970 B2 *  3/2025   Han ................... H10D 30/6757
(Continued)

FOREIGN PATENT DOCUMENTS

CN    101055878 A    10/2007
CN    101308303 A    11/2008
(Continued)

OTHER PUBLICATIONS

Chinese Office Action, mailed Sep. 23, 2022, from Chinese Application No. 202010095983.7.
(Continued)

*Primary Examiner* — Ke Xiao
*Assistant Examiner* — Nelson Lam
(74) *Attorney, Agent, or Firm* — Workman Nydegger

(57) ABSTRACT

Provided are a display substrate, an organic light-emitting display panel, and a display device. A shielding layer is arranged between a first gate metal layer and a source-drain metal layer such that same are insulated from each other, an orthographic projection, on a base substrate, of the shielding layer covers at least an orthographic projection, on the base substrate, of an overlapping area of a scanning signal line and a detection signal line, and the shielding layer is coupled to a fixed voltage.

17 Claims, 7 Drawing Sheets

(51) Int. Cl.
*H10K 59/131* (2023.01)
*H10K 102/00* (2023.01)

(58) Field of Classification Search
CPC .... G09G 3/3233; G09G 3/3241; G09G 3/325; G09G 3/3258; G09G 3/3266; G09G 3/3275; G09G 3/3283; G09G 3/3291
USPC ...................................................... 345/76–83
See application file for complete search history.

(56) References Cited

U.S. PATENT DOCUMENTS

| | | | |
|---|---|---|---|
| 2008/0186434 A1 | 8/2008 | Yun et al. | |
| 2009/0284449 A1* | 11/2009 | Lee | H10K 59/1216 345/76 |
| 2010/0019996 A1* | 1/2010 | You | H01L 27/1214 345/76 |
| 2013/0201086 A1* | 8/2013 | Sun | H10K 59/131 345/76 |
| 2015/0279917 A1* | 10/2015 | Yang | H10K 59/126 257/40 |
| 2015/0364500 A1 | 12/2015 | Cheng et al. | |
| 2015/0379923 A1* | 12/2015 | Lee | H10K 59/1315 345/82 |
| 2019/0181155 A1 | 6/2019 | Li et al. | |
| 2021/0012687 A1* | 1/2021 | Li | G06F 1/1652 |
| 2022/0271114 A1 | 8/2022 | Yin et al. | |
| 2023/0144054 A1* | 5/2023 | Kim | H10D 86/443 345/59 |

FOREIGN PATENT DOCUMENTS

| | | |
|---|---|---|
| CN | 101621063 A | 1/2010 |
| CN | 103257499 A | 8/2013 |
| CN | 203883006 U | 10/2014 |
| CN | 107958922 A | 4/2018 |
| CN | 111293126 A | 6/2020 |

OTHER PUBLICATIONS

Chinese First Office Action, mailed Mar. 25, 2022, from Chinese Application No. 202010095983.7.

* cited by examiner

ORGANIC LIGHT-EMITTING DIODE (OLED) DISPLAY PANEL WITH SHIELDING LAYER ABSORBING NOISE ON SCANNING SIGNAL LINES

CROSS-REFERENCE TO RELATED APPLICATIONS

The present disclosure is a National Stage of international Application No. PCT/CN2021/073397 filed Jan. 22, 2021, which claims priority to the Chinese patent application No. 202010095983.7, filed to the CNIPA on Feb. 17, 2020, and entitled "ARRAY SUBSTRATE, ORGANIC LIGHT-EMITTING DISPLAY PANEL AND DISPLAY DEVICE", the contents of which are incorporated into the present disclosure by reference in its entirety.

FIELD

The present disclosure relates to the technical field of display, in particular to a display substrate, an organic light-emitting display panel and a display device.

BACKGROUND

Organic light emitting diodes (OLEDs) are one of hotspots in the current research field of flat panel displays, and compared with a liquid crystal display (LCD), an OLED display has the advantages of low energy consumption, low production cost, self-illumination, wide viewing angle, high response speed and the like. At present, OLED displays have already begun to replace traditional LCDs in the display fields of mobile phones, tablet personal computers, digital cameras and the like.

SUMMARY

Embodiments of the present disclosure provide a display substrate, including:
  a base substrate;
  a first gate metal layer, disposed on a side of the base substrate, the first gate metal layer includes a scanning signal line;
  a source-drain metal layer, disposed on a side of the first gate metal layer facing away from the base substrate, wherein the source-drain metal layer includes a detection signal line, the detection signal line and the scanning signal line are insulated and crossed, and an orthographic projection, on the base substrate, of the scanning signal line and an orthographic projection, on the base substrate, of the detection signal line have overlapping areas; and
  a shielding layer, disposed between the first gate metal layer and the source-drain metal layer, wherein the shielding layer is insulated from the scanning signal line and the detection signal line respectively, an orthographic projection, on the base substrate, of the shielding layer at least covers the overlapping areas, and the shielding layer is coupled to a fixed voltage.

In some embodiments, an area of the orthographic projection, on the base substrate, of the shielding layer is larger than an area of the overlapping areas.

In some embodiments, the display substrate further includes a pixel circuit electrically connected with the detection signal line and the scanning signal line, and a light-emitting device electrically connected with the pixel circuit, wherein the light-emitting device is a top-emitting device, and the shielding layer is arranged on a whole surface.

In some embodiments, the display substrate further includes a pixel circuit electrically connected with the detection signal line and the scanning signal line, and a light-emitting device electrically connected with the pixel circuit, wherein the light-emitting device is a bottom-emitting device, and the orthographic projection, on the base substrate, of the shielding layer does not overlap with an orthographic projection, on the base substrate, of the light-emitting device.

In some embodiments, the shielding layer is of a latticed structure including a plurality of meshes.

In some embodiments, the shielding layer is provided with a plurality of shielding parts, the plurality of shielding parts are independent of each other, and an orthographic projection, on the base substrate, of each of the plurality of shielding parts covers the overlapping areas.

In some embodiments, the display substrate further includes a conductive connecting line, and each of the plurality of shielding parts is connected to the fixed voltage through the conductive connecting line.

In some embodiments, the shielding parts are grounded through the conductive connecting line.

In some embodiments, the source-drain metal layer further includes a plurality of power signal lines, and each of the plurality of shielding parts is electrically connected with an adjacent one of the plurality of power signal lines through the conductive connecting line.

In some embodiments, the source-drain metal layer further includes a plurality of power signal lines, and the plurality of shielding parts, after being connected with each other through the conductive connecting line, are electrically connected with one of the plurality of power signal lines.

In some embodiments, the display substrate also includes a second gate metal layer arranged between the first gate metal layer and the source-drain metal layer; and the shielding layer is arranged on a same layer as the second gate metal layer.

In some embodiments, the display substrate further includes a second gate metal layer arranged between the first gate metal layer and the source-drain metal layer; and the shielding layer is arranged between the second gate metal layer and the source-drain metal layer.

In some embodiments, a material of the shielding layer is a metal material.

Embodiments of the present disclosure further provide an organic light-emitting display panel, and the organic light-emitting display panel includes any one of the display substrates provided by above embodiments of the present disclosure.

Embodiments of the present disclosure further provide a display device, and the display device includes the organic light-emitting display panel provided by above embodiments of the present disclosure.

DETAILED DESCRIPTION OF THE EMBODIMENTS

In order to make the purpose, technical solutions and advantages of the present disclosure clearer, the specific implementation modes of a display substrate, an organic light-emitting display panel and a display device provided by embodiments of the present disclosure will be described in detail in conjunction with the accompanying drawings.

The thickness and shape of each film layer in the accompanying drawings do not reflect the real proportion of the display substrate and are only local structures of the display substrate, and the purpose is only to illustrate the content of the present disclosure.

Figure 1:
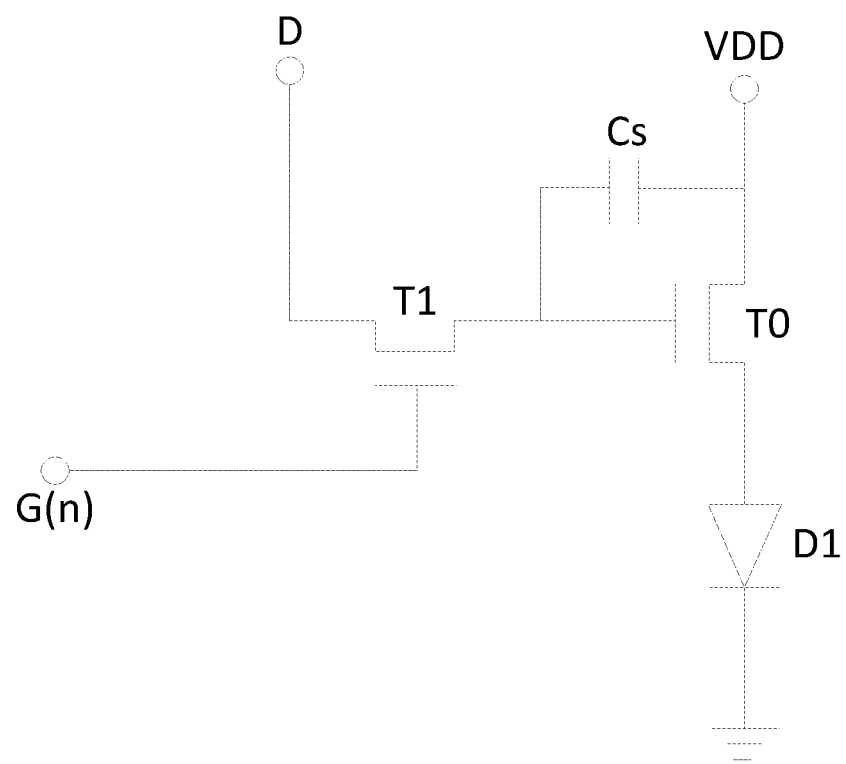
FIG. 1 is a structural schematic diagram of a pixel circuit in related art.

Different from an LCD using stable voltage to control brightness, an OLED is current driven, and needs stable current to control luminescence of the OLED. In a 2T1C pixel circuit as shown in FIG. 1, the circuit is composed of a driving transistor T1, a switching transistor T1 and a storage capacitor Cs. When a scanning line G(n) selects a certain row for scanning, the scanning line G(n) inputs a low-level signal, the P-type switching transistor T1 is turned on, and the voltage of a data line D is written into the storage capacitor Cs; and after the scanning of the row is finished, the signal input by the scanning line G(n) is changed into a high level, the P-type switching transistor T1 is turned off, and the data voltage stored by the storage capacitor Cs enables the driving transistor T0 to generate current to drive the OLED, so that it is ensured that the OLED can continuously emit light in one frame. According to the transfer characteristic of the driving transistor T0, the current passing through the driving transistor T0

$$I_D = \frac{1}{2}\mu C_{OX}\frac{W}{L}(V_{GS}-V_{TH})^2 = \frac{1}{2}\mu C_{OX}\frac{W}{L}(V_{GS}+|V_{TH}|)^2,$$

where $V_{TH}$ contains a negative sign. Wherein the VGS is the gate-source voltage of the driving transistor T0, the $V_{TH}$ is the threshold voltage of the driving transistor T0, $C_{ox}$ is the oxide layer capacitance of the driving transistor T0, the W/L is the width-length ratio of the driving transistor T0, and the $V_{Gs}=V_D-V_{DD}$, thus $$I_D = \frac{1}{2}\mu_n C_{OX}\frac{W}{L}(V_d - ELV_{DD} - V_{TH})^2.$$

According to the formula of the current ID of the driving transistor T0, in the driving circuit of the OLED, the current of the driving transistor T0, the threshold voltage $V_{TH}$ of the driving transistor T0 and the power voltage $V_{DD}$ have a quadratic relationship, as long as the threshold voltage $V_{TH}$ of the driving transistor T0 between pixels exceeds the difference of more than 0.1 V, deviation of the current of the driving transistor T0 will be caused. Therefore, the brightness of the OLED is correspondingly different, and the problem that the brightness of a displayed image is not uniform is generated.

In order to solve the problem that the brightness of a displayed image is not uniform due to the difference of threshold voltages of all driving transistors in a pixel circuit, a pixel internal compensation method is generally adopted, before a data signal Data is written into a pixel, a signal with a threshold voltage $V_{TH}$ of a driving transistor T0 is written into a storage capacitor Cs, and after the data signal Data is written into the storage capacitor Cs, the data signal Data and $V_{TH}$ are stored in the storage capacitor Cs, during pixel driving, the threshold voltage $V_{TH}$ of the driving transistor T0 and the $V_{TH}$ in the storage capacitor Cs are counteracted, and the influence of the threshold voltage $V_{TH}$ of the driving transistor T0 on the driving current of the driving transistor T0 is avoided. Certainly, internal compensation needs to write $V_{TH}$ into a storage capacitor Cs firstly, so that more transistors (such as T1-T8 or more) and control signal lines (such as Reset scanning lines, Gate scanning lines and EM scanning lines) and the like are necessarily needed, the production process has the process requirements of minimum line width, minimum line spacing and the like, and the pixel size is very small at high resolution, therefore wiring is very difficult.

Therefore, in order to improve the high resolution and the aperture ratio of the pixel, a pixel scheme and driving method for PMOS external compensation are provided, that is, electrical parameters of devices in a pixel circuit are detected through an analog-to-digital conversion device (ADC device) in a chip (IC), and then compensation data are added to pixel data in the IC, so that the brightness non-uniformity of the pixel is compensated. When the display screen is subjected to $V_{TH}$ detection through the ADC device, a numerical value read by the ADC device serves as a $V_{TH}$ value of a driving transistor in the pixel circuit and is used for algorithm operation. The ADC device generally reads a $V_{TH}$ value of the driving transistor through a detection signal line Sensing, but the precision and accuracy of the $V_{TH}$ value read by the ADC device will affect the effect of compensating for the image quality of a whole display screen. Factors influencing the precision and accuracy of the $V_{TH}$ value mainly come from noise on the detection signal line Sensing, so that the detection noise on the detection signal line Sensing seriously affects the compensation effect of an external compensation technology in the external compensation technology.

Figure 2A:
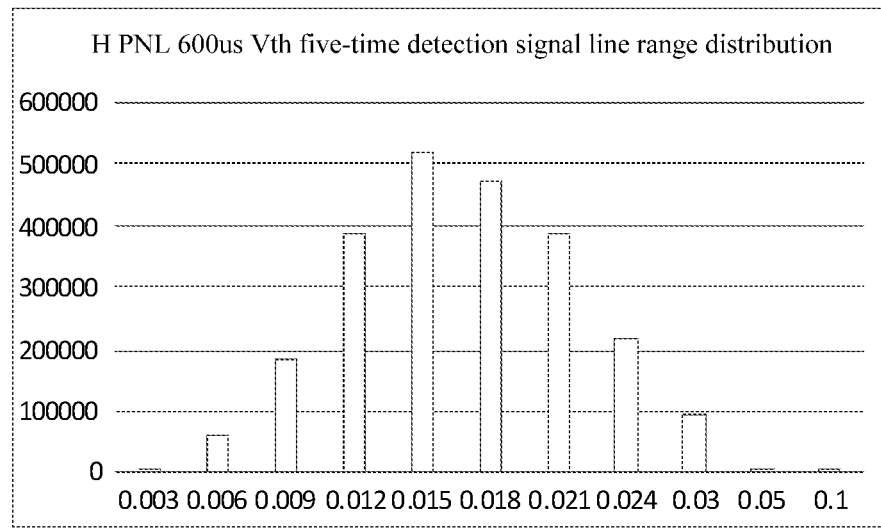
FIG. 2A and FIG. 2B are distribution diagrams of the influence of the noise of VGH and VGL on the noise of a detection signal line respectively.
Figure 2B:
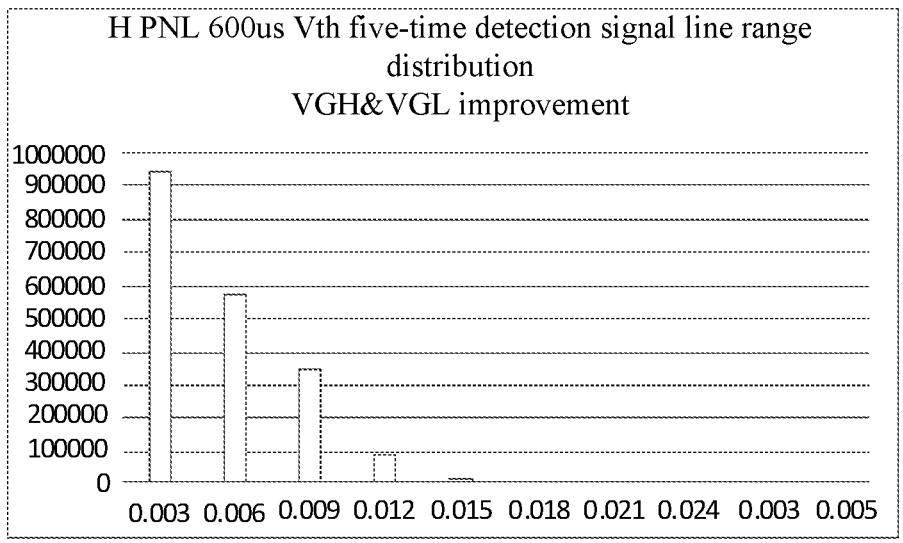

In the external compensation technology, it is found through analysis of noise of the detection signal line Sensing of the ADC device that the noise on the detection signal line Sensing mainly comes from noise of VGH, VGL and CLK of GOA. Experiments show the influence of the noise of the VGH, the VGL and the CLK on the noise of the detection signal line Sensing. Table 1 and Table 2 are respectively a voltage (Value) value and a noise (P-P noise) value on each signal line (Signal) in the pixel circuit, and are different in voltage and noise of VGH and VGL, as shown in FIG. 2A and FIG. 2B, FIG. 2A is a distribution diagram of noise on the detection signal line Sensing when the noise (noise) on the VGH and VGL in Table 1 is 70-80 mV, and FIG. 2B is a distribution diagram of noise on the detection signal line Sensing when the noise (noise) on the VGH and VGL in Table 2 is 20-40 mV.

TABLE 1

| Signal | Value | P-P noise |
|---|---|---|
| VDD | 5.511 V | 7.019 mV |
| Vini | −0.972 V | 11.9 mV |
| VGH | 6.987 V | 73.85 mV |
| VGL | −6.834 V | 87.59 mV |
| VDD | 7.981 V | 11.9 mV |
| VSS | −7.908 V | 12.82 mV |

TABLE 2

| Signal | Value | P-P noise |
|---|---|---|
| VDD | 5.511 V | 7.019 mV |
| Vini | −0.972 V | 11.9 mV |
| VGH | 7.0261 V | 24.11 mV |
| VGL | −6.9 V | 38.15 mV |
| VDD | 7.981 V | 11.9 mV |
| VSS | −7.908 V | 12.82 mV |

It can be seen by comparing FIG. 2A with FIG. 2B that, all conditions of the same display screen are the same, and when the noise of the VGH and the noise of the VGL are changed, namely when the noise of the VGH and the noise of the VGL are reduced to 20-40 mV from 70-80 mV, the noise on the detection signal line Sensing of the ADC device is reduced to 3-9 mV from 9-24 mV. Therefore, it can be proved that the noise of the VGH and the noise of the VGL have a great influence on the noise of the detection signal line Sensing.

Figure 3A:
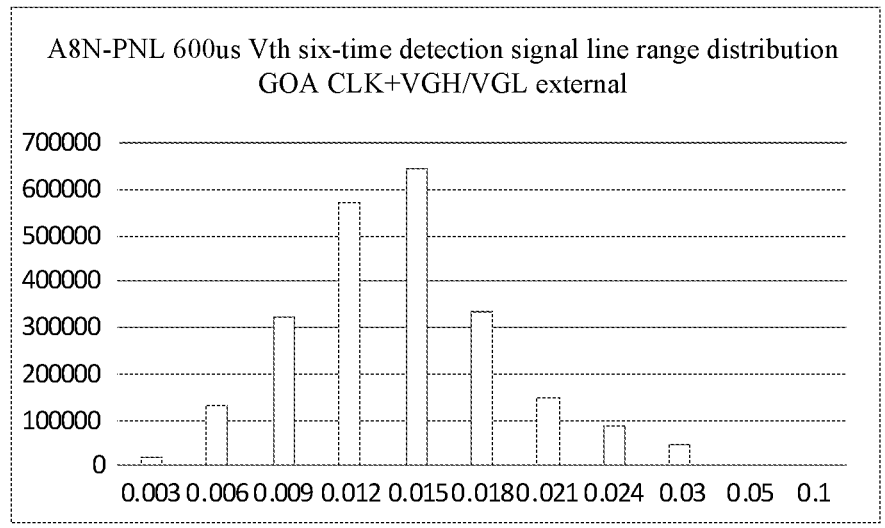
FIG. 3A and FIG. 3B are distribution diagrams of noise on the detection signal line when the CLK is turned on and turned off respectively.
Figure 3B:
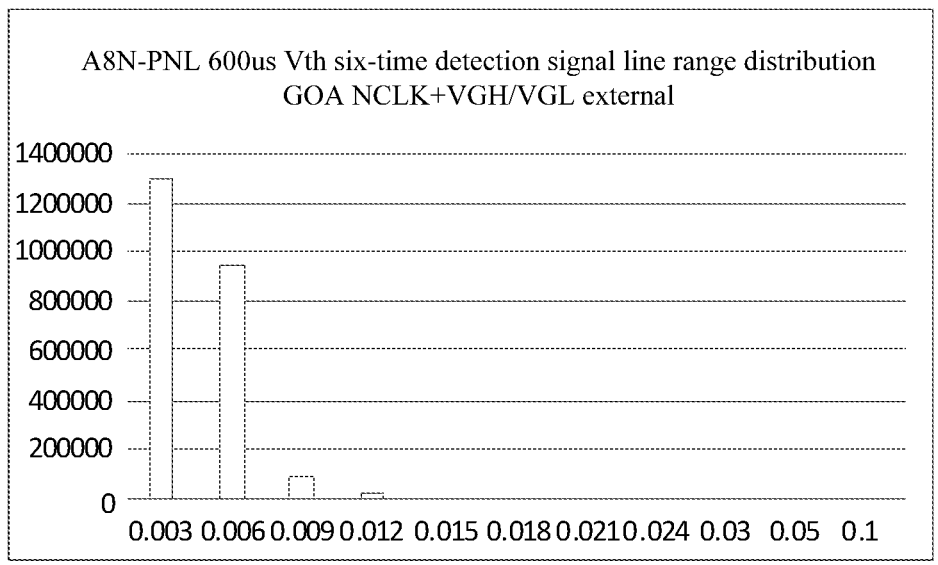

Next, noise on the Sensing is analyzed when the CLK of the GOA is turned on and turned off, as shown in FIG. 3A and FIG. 3B, FIG. 3A is a distribution diagram of noise on the signal line Sensing when the CLK is turned on (60 Hz), and FIG. 3B is a distribution diagram of noise on the signal line Sensing when the CLK is turned off. Although an STV signal is in a VGH high level and Gate(n)/Reset(n)/EM(n) output for scanning GOA is in a high level, the noise range of the detection signal line Sensing of the ADC device is also in a range of 6-24 mV (FIG. 3A), and when CLKs of GOA are all closed (FIG. 3B) and a stable level VGL is used, the noise of the detection signal line Sensing of the ADC device is reduced to 3-6 mV. Therefore, it can be proved that the noise of the CLK has a great influence on the noise of the detection signal line Sensing.

In conclusion, in the external compensation technology, the noise of the VGH/VGL signal and the on/off of the CLK signal are directly associated with the scanning signal (Gn/EMN/Rn and the like) of the pixel circuit, and are coupled to the detection signal line through the scanning signal. Therefore, how to reduce the coupling between the scanning line and the detection signal line is particularly important for reducing the noise of the detection signal line Sensing.

Figure 4:
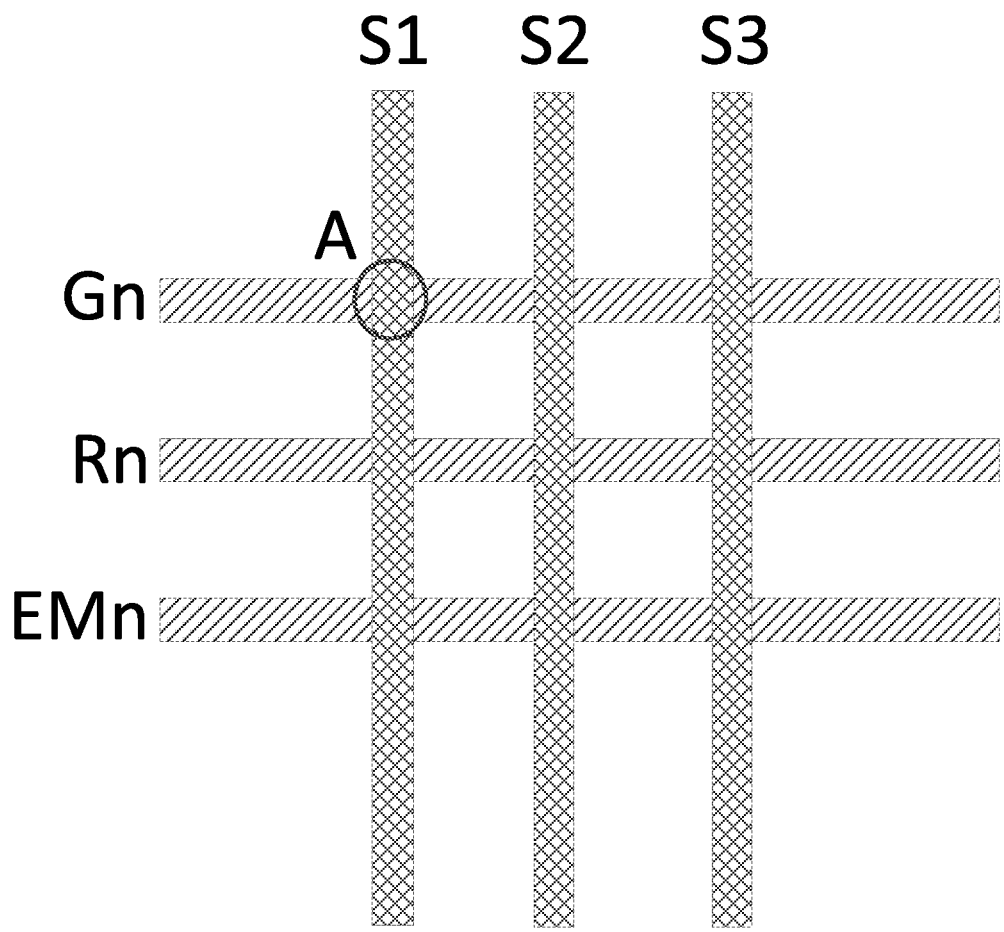
FIG. 4 is a top-viewed structural schematic diagram of a display substrate in related technologies.
Figure 5:
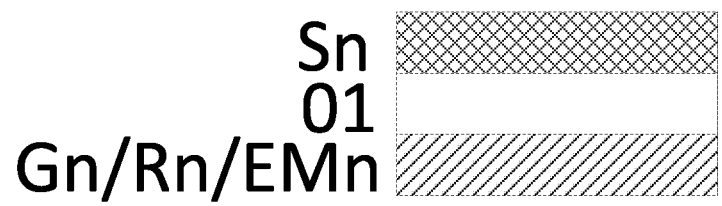
FIG. 5 is a cross-sectional structural schematic diagram corresponding to FIG. 4.

In the related art, according to the structure of the display screen, VGH, VGL and CLK signals of GOA are all power voltage and shift clock signals provided for a scanning circuit (GOA circuit) in the display screen, and the output of the scanning circuit is connected to a scanning signal line of the pixel circuit. A gate scanning circuit outputs scanning signals G1-Gn, a reset scanning circuit outputs reset scanning signals R1-Rn, and a light-emitting scanning circuit outputs light-emitting scanning signals EM1-EMn. Specifically, as shown in FIG. 4 and FIG. 5, FIG. 4 is a top-viewed structural schematic diagram of part of film layers of the display substrate, FIG. 5 is a cross-sectional structural schematic diagram of the film layers in FIG. 4, the display substrate includes scanning signal lines (Gn, Rn and EMn) and detection signal lines (S1, S2, S3 . . . ) which are insulated and crossed, generally, the scanning signal lines (Gn, Rn and EMn) are transverse, and the detection signal lines (S1, S2, S3 . . . ) are vertical. Therefore, the detection signal lines (S1, S2, S3 . . . ) and the scanning signal lines (Gn, Rn and EMn) have overlapping areas A, an insulating layer 01 generally made of silicon dioxide is arranged between the detection signal lines (S1, S2, S3 . . . ) and the scanning signal lines (Gn, Rn and EMn) for insulating the detection signal lines (S1, S2, S3 . . . ) from the scanning signal lines (Gn, Rn and EMn); the detection signal lines (S1, S2, S3 . . . ) and the scanning signal lines (Gn, Rn and EMn) are both metal lines, and the overlapping areas A is a coupling capacitor, so that noise (from VGH/VGL and level fluctuation caused by on and off of the CLK of GOA) on the scanning signal lines (Gn, Rn and EMn) is coupled to the detection signal lines (S1, S2, S3 . . . ) through the coupling capacitor; and the precision and accuracy of the threshold voltage $V_{TH}$ of the driving transistor read by the detection signal lines (S1, S2, S3 . . . ) are affected, so that the effect of an external compensation technology compensating for the image quality of the whole display screen is influenced.

Figure 6:
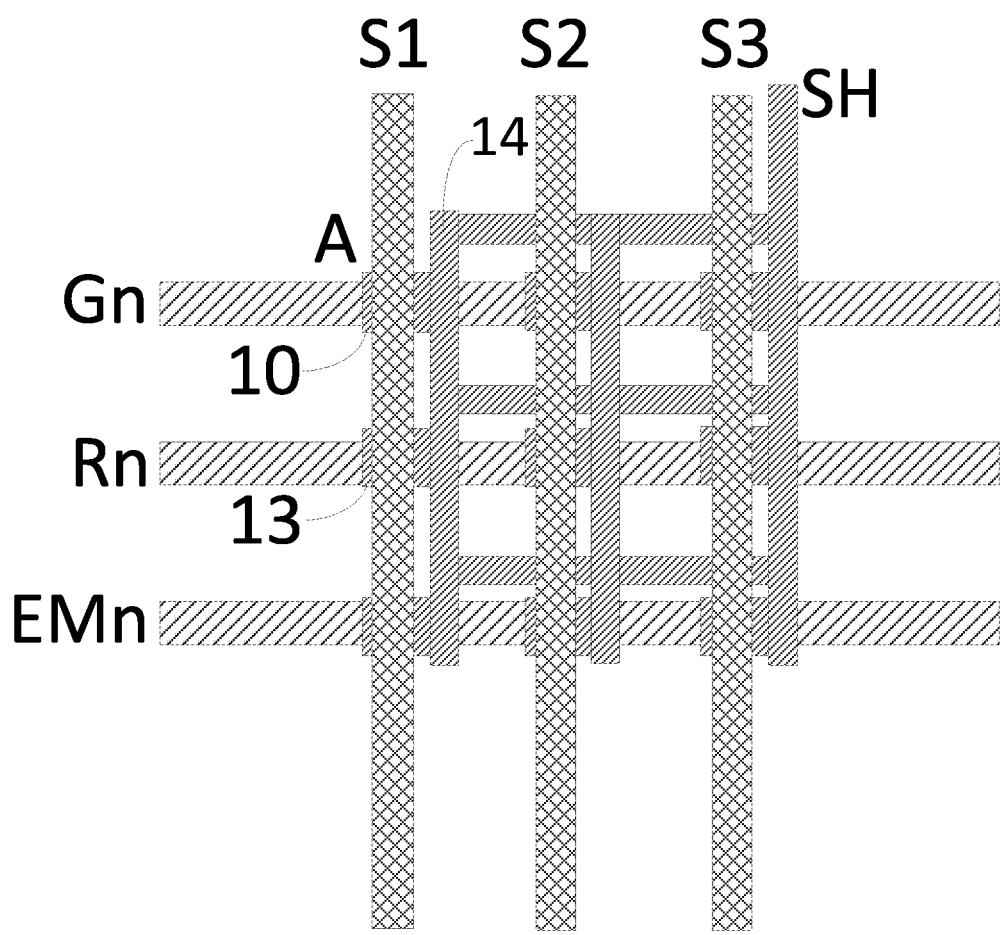
FIG. 6 is a top-viewed structural schematic diagram of a display substrate provided by the embodiment of the present disclosure.
Figure 7:
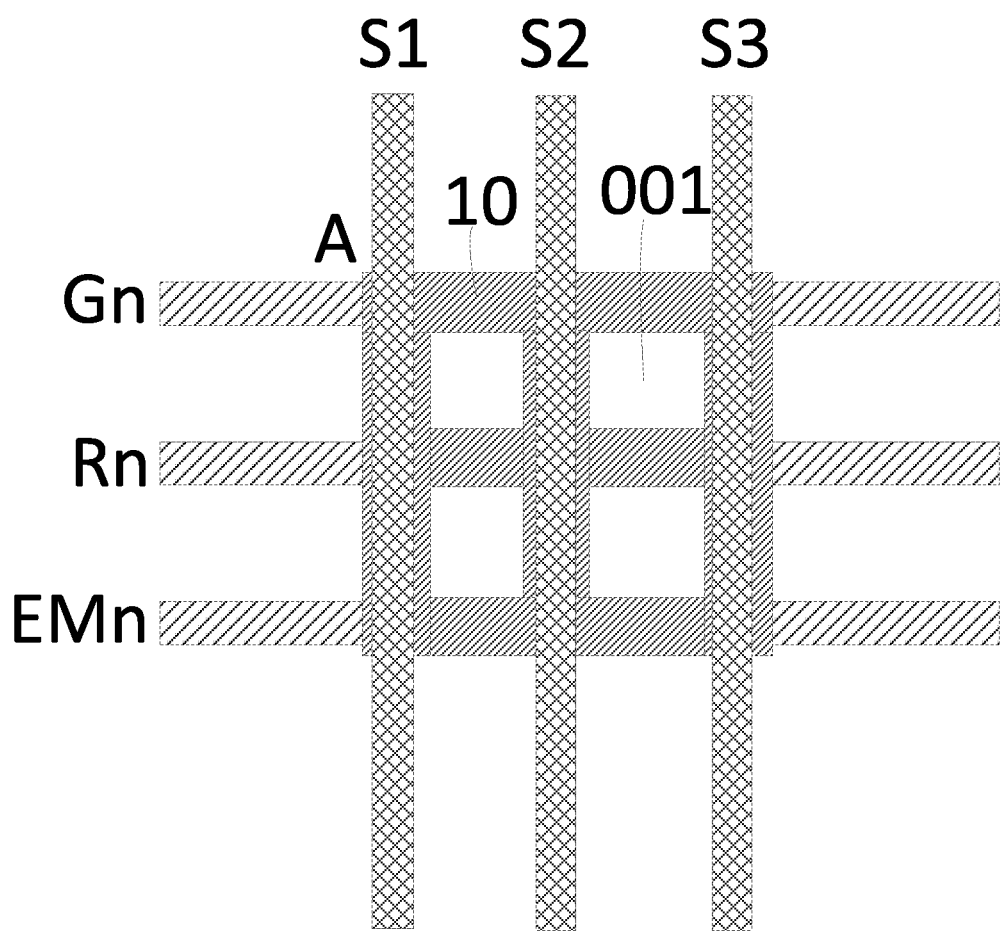
FIG. 7 is another top-viewed structural schematic diagram of the display substrate provided by the embodiment of the present disclosure.
Figure 8:
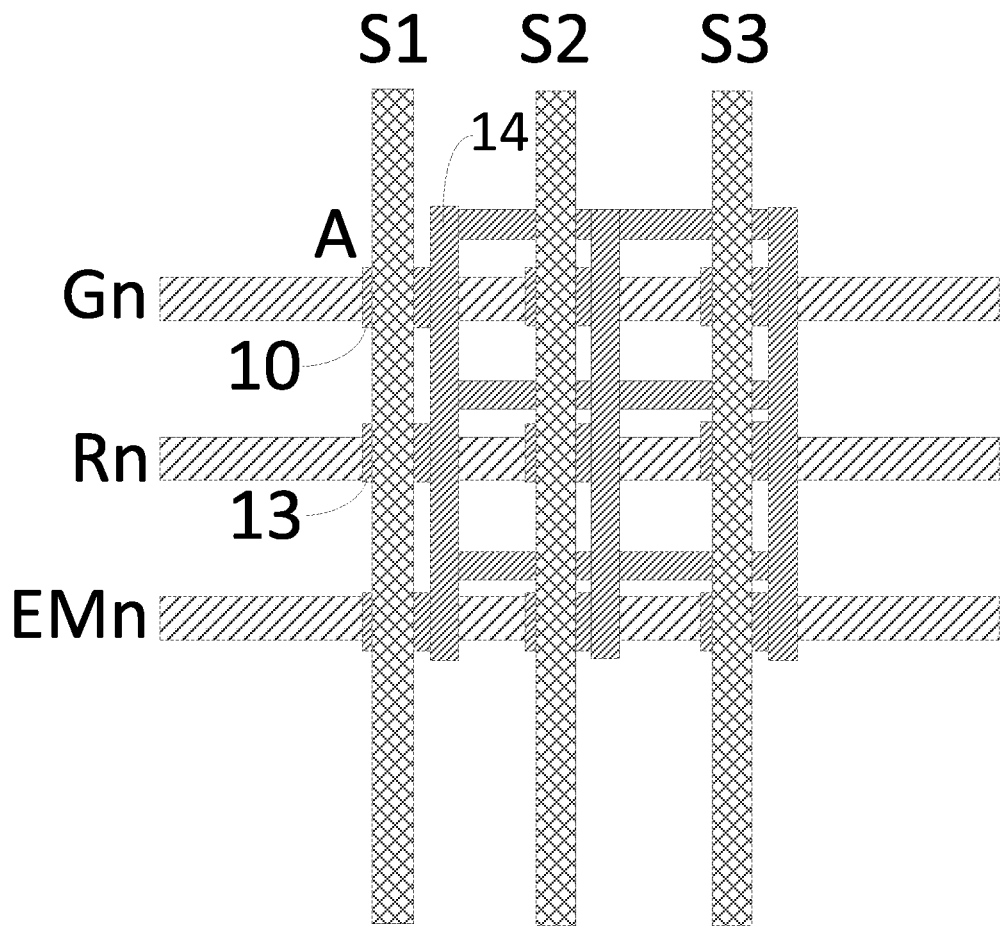
FIG. 8 is another top-viewed structural schematic diagram of the display substrate provided by the embodiment of the present disclosure.
Figure 9:
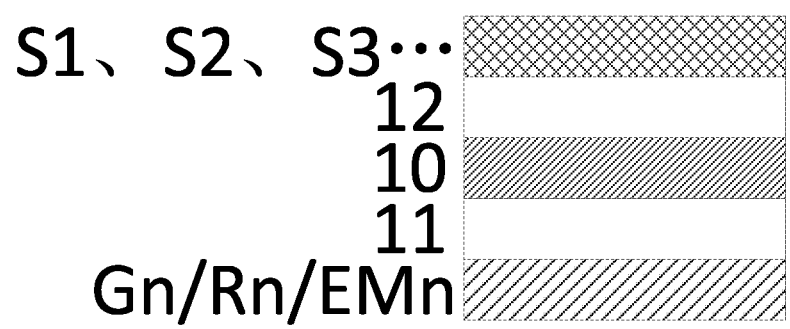
FIG. 9 is a cross-sectional structural schematic diagram corresponding to FIG. 6, FIG. 7 and FIG. 8.

In view of this, embodiments of the present disclosure provide a display substrate, as shown in FIG. 6, FIG. 7, FIG. 8 and FIG. 9. FIG. 6, FIG. 7 and FIG. 8 are top-viewed structural schematic diagrams of parts of three kinds of film layers of the display substrate, and FIG. 9 is a cross-sectional structural schematic diagram of the film layers in FIG. 6, FIG. 7 and FIG. 8. The display substrate includes a base substrate (not shown), and a first gate metal layer and a source-drain metal layer that are sequentially stacked on the base substrate, the first gate metal layer includes scanning signal lines (Gn, Rn and EMn), the source-drain metal layer includes detection signal lines (S1, S2, S3 . . . ), and the scanning signal lines (Gn, Rn and EMn) and the detection signal lines (S1, S2, S3 . . . ) are insulated and crossed.

The display substrate further includes a shielding layer 10 disposed between the first gate metal layer and the source-drain metal layer, the shielding layer 10 is insulated from the scanning signal lines (Gn, Rn and EMn), the shielding layer 10 is insulated from the detection signal lines (S1, S2, S3 . . . ), a first insulating layer 11 is arranged between the shielding layer 10 and the scanning signal lines (Gn, Rn and EMn), and a second insulating layer 12 is arranged between the shielding layer 10 and the detection signal lines (S1, S2, S3 . . . ). An orthographic projection, on the base substrate, of the scanning signal line (Gn, Rn and EMn) and an orthographic projection, on the base substrate, of the detection signal line (S1, S2, S3 . . . ) have overlapping areas A. The orthographic projection, on the base substrate, of the shielding layer 10 at least covers the orthographic projections, on the base substrate, of the overlapping areas A, and the shielding layer 10 is coupled to a fixed voltage.

According to the display substrate provided by embodiments of the present disclosure, the shielding layer is arranged between the first gate metal layer and the source-drain metal layer such that the first gate metal layer and the source-drain metal layer are insulated from each other, the orthographic projection, on the base substrate, of the shielding layer at least covers the orthographic projections, on the base substrate, of the overlapping areas of the scanning signal lines and the detection signal lines, and the shielding layer is coupled to the fixed voltage, so that the potential of the shielding layer does not change, in such a way, the shielding layer can reduce the coupling capacitance between the scanning signal lines and the detection signal lines, and the noise on the scanning signal lines can be absorbed by the shielding layer without being coupled to the detection signal lines, so that the noise on the detection signal lines can be greatly reduced; and the effect of an external compensation technology compensating for the image quality of the whole display screen is improved.

In some embodiments, the shielding layer being coupled to the fixed voltage means that the shielding layer may be fixedly connected to a ground voltage (which will be described later); in other embodiments, the shielding layer may be connected to any reference voltage having a fixed potential (e.g., ELVDD, etc.).

In some embodiments, in order to effectively reduce the coupling capacitance between the scanning signal lines and the detection signal lines, in the display substrate provided by the embodiment of the present disclosure, as shown as FIG. 6, FIG. 7 and FIG. 8, the area of the orthographic projection, on the base substrate, of the shielding layer 10 is larger than the area of the orthographic projections, on the base substrate, of the overlapping areas A of the scanning signal lines (Gn, Rn and EMn) and the detection signal lines (S1, S2, S3 . . . ). Thus, the shielding layer 10 can shield the whole overlapping area A, noise on the scanning signal lines (Gn, Rn and EMn) will not affect the detection signal lines (S1, S2, S3 . . . ) at all, and the effect of an external compensation technology compensating for the image quality of the whole display screen is further improved. Certainly, the area of the shielding layer should not be too large, and may be set according to actual needs.

In some embodiments, the display substrate may further include a pixel circuit electrically connected with the detection signal lines and the scanning signal lines, and a light-emitting device electrically connected with the pixel circuit; when the light-emitting device is a top-emitting device, the shielding layer may be arranged on the whole surface. And the whole-surface arrangement means that when the shielding layer is fabricated, the orthographic projection, on the base substrate, of the shielding layer covers the whole base substrate. In some embodiments, the light emitting direction of the top-emitting device is the direction facing away from the base substrate, the light emitting device is fabricated on the side, facing away from the base substrate, of the pixel circuit, and the shielding layer is fabricated in the film layer of the pixel circuit, so that the shielding layer arranged on the whole surface will not affect light emission of the light emitting device, and the film layer of the shielding layer arranged on the whole surface is easy to fabricate; the fabrication process can be reduced, and fabrication is convenient.

In some embodiments, when the light emitting device is a bottom-emitting device, the orthographic projection, on the base substrate, of the shielding layer should not overlap with the orthographic projection, on the base substrate, of the light emitting device. Therefore, the shielding layer will not shield the light-emitting device, and the light-emitting effect of the bottom-emitting device is not affected.

In some embodiments, in the display substrate provided by the embodiment of the present disclosure, as shown in FIG. 7, the shielding layer 10 may be of a latticed structure including a plurality of meshes 001; or as shown in FIG. 6 and FIG. 8, the shielding layer 10 may be provided with a plurality of independent shielding parts 13, and the orthographic projection, on the base substrate, of one shielding part 13 covers one overlapping area A. The shielding layer 10 adopts the structure shown in FIG. 6 to FIG. 8, so that the materials for fabricating the shielding layer 10 can be saved, and the light emitting efficiency of the light emitting device is not influenced at all.

In some embodiments, the shielding layer adopted by the top-emitting device may also be the shielding layer structure adopted by the bottom-emitting device as shown in FIG. 6 to FIG. 8, which will not be enumerated.

In some embodiments, as shown in FIG. 6, when the shielding layer 10 is provided with a plurality of independent shielding parts 13, the display substrate further includes conductive connecting lines 14, and the shielding parts 13 may be connected to the same fixed voltage line SH through the conductive connecting lines 14.

In some embodiments, in order to ensure that the shielding layer can absorb noise on the scanning signal line more effectively, in the display substrate provided by the embodiment of the present disclosure, as shown in FIG. 7, the latticed shielding layer 10 is grounded, and as shown in FIG. 6 and FIG. 8, the shielding parts 13 are grounded through the conductive connecting lines 14.

It needs to be explained that the shielding parts being grounded through the conductive connecting lines means that the display substrate provided by embodiments of the present disclosure is provided with a grounding signal end, and the shielding parts are electrically connected with the grounding signal end through the conductive connecting lines. In some embodiments, the signal of the grounding signal end is 0 V, so that the noise on the scanning signal line can be shielded by the signal of the grounding signal end.

In some embodiments, the source-drain metal layer may further include a plurality of power signal lines (such as ELVDD), each of the plurality of shielding parts may be electrically connected with an adjacent one of the plurality of power signal lines through conductive connecting lines, and in the scheme, via holes are formed in the insulating layer between the shielding parts and the adjacent power signal lines, and the via holes are filled with the conductive connecting lines, namely the shielding parts are electrically connected with the adjacent power signal lines through the conductive connecting lines in the via holes. In this way, the shielding layer is connected to a power line, so that the number of signal lines in the display substrate can be reduced, and nearby wiring can be achieved in the pixels.

In some embodiments, in the display substrate provided by embodiments of the present disclosure, as shown in FIG. 8, the shielding parts 13 are electrically connected with one power signal line through a via hole after being connected through the conductive connecting lines 14, so that only one via hole needs to be formed between the shielding parts 13 and the power signal line, and the requirements of the fabricating process can be reduced. In this way, the shielding layer is connected to the power line, so that the number of signal lines in the display substrate can be reduced, and nearby wiring can be achieved in the pixels.

In some embodiments, the display substrate further includes a second gate metal layer arranged between the first gate metal layer and the source-drain metal layer; the second gate metal layer is generally used for forming a storage capacitor in a pixel circuit, and the shielding layer may be located on the second gate metal layer. Therefore, the patterns of the shielding layer and the second gate metal layer can be formed through a one-time patterning process only by changing the original patterning pattern when the second gate metal layer is formed, a process for independently preparing the shielding layer does not need to be added, the preparation process flow can be simplified, the production cost can be reduced, and the production efficiency can be improved. Therefore, the coupling capacitance between the scanning signal lines and the detection signal lines can be shielded on the basis of not increasing the thickness of the display substrate. Alternatively, the shielding layer may also be arranged between the second gate metal layer and the source-drain metal layer. The above situations both belong to the protection range of the present disclosure.

In some embodiments, the shielding layer may be made of a metal material. And, the shielding layer is made of a metal material with low resistivity as much as possible, so that noise on the scanning signal lines can be absorbed by the shielding layer as soon as possible.

Based on the same inventive concept, embodiment of the present disclosure further provide an organic light-emitting display panel which includes the display substrate provided by embodiments of the present disclosure. The problem solving principle of the organic light-emitting display panel is similar to that of the display substrate, so that the implementation of the organic light-emitting display panel can refer to the implementation of the display substrate, and the repetition will not be repeated here.

Based on the same inventive concept, embodiments of the present disclosure further provide a display device which includes the organic light-emitting display panel provided by embodiments of the present disclosure. The display device may be any product or part with a display function, such as a mobile phone, a tablet personal computer, a television, a display, a notebook computer, a digital photo frame, and a navigator. The problem solving principle of the display device panel is similar to that of the display substrate, so that the implementation of the display device can refer to the implementation of the display substrate, and the repetition will not be repeated here.

According to the display substrate, the organic light-emitting display panel and the display device provided by the embodiment of the present disclosure, the shielding layer is arranged between the first gate metal layer and the source-drain metal layer, and the orthographic projection, on the base substrate, of the shielding layer covers at least the orthographic projections, on the base substrate, of the overlapping areas of the scanning signal lines and the detection signal lines; the shielding layer is coupled to the fixed voltage, so that the shielding layer can reduce the coupling capacitance between the scanning signal lines and the detection signal lines, and the noise on the scanning signal lines can be absorbed by the shielding layer without being coupled to the detection signal lines, so that the noise on the detection signal lines can be greatly reduced; and the effect of an external compensation technology compensating for the image quality of the whole display screen is improved.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent art, the present disclosure also intends to include these modifications and variations.

What is claimed is:

1. A display substrate, comprising:
   a base substrate;
   a first gate metal layer, disposed on a side of the base substrate, wherein the first gate metal layer comprises a scanning signal line;
   a source-drain metal layer, disposed on a side of the first gate metal layer facing away from the base substrate, wherein the source-drain metal layer comprises a detection signal line, the detection signal line and the scanning signal line are insulated and crossed from each other, and an orthographic projection, on the base substrate, of the scanning signal line and an orthographic projection, on the base substrate, of the detection signal line have overlapping areas;
   a shielding layer, disposed between the first gate metal layer and the source-drain metal layer, wherein the shielding layer is insulated from the scanning signal line and the detection signal line respectively, an orthographic projection, on the base substrate, of the shielding layer at least covers the overlapping areas, and the shielding layer is coupled to a fixed voltage;
   a pixel circuit electrically connected to the detection signal line and the scanning signal line; and
   a light-emitting device electrically connected to the pixel circuit;
   wherein the light-emitting device is a bottom-emitting device, and the orthographic projection, on the base substrate, of the shielding layer does not overlap with an orthographic projection, on the base substrate, of the light-emitting device; and
   the shielding layer is provided with a plurality of shielding parts, the plurality of shielding parts are independent of each other, and an orthographic projection, on the base substrate, of each of the plurality of shielding parts covers a corresponding one of the overlapping areas.

2. The display substrate according to claim 1, wherein an area of the orthographic projection, on the base substrate, of the shielding layer is larger than an area of the overlapping areas.

3. The display substrate according to claim 1, wherein the shielding layer is of a latticed structure comprising a plurality of meshes.

4. The display substrate according to claim 1, further comprising a conductive connecting line, wherein each of the plurality of shielding parts is connected to the fixed voltage through the conductive connecting line.

5. The display substrate according to claim 4, wherein the shielding parts are grounded through the conductive connecting line.

6. The display substrate according to claim 4, wherein the source-drain metal layer further comprises a plurality of power signal lines; and
   each of the plurality of shielding parts is electrically connected to an adjacent one of the plurality of power signal lines through the conductive connecting line.

7. The display substrate according to claim 4, wherein the source-drain metal layer further comprises a plurality of power signal lines; and
   the plurality of shielding parts, after being connected to each other through the conductive connecting line, are electrically connected to one of the plurality of power signal lines.

8. The display substrate according to claim 1, further comprising a second gate metal layer arranged between the first gate metal layer and the source-drain metal layer;
   wherein the shielding layer is arranged on a same layer as the second gate metal layer.

9. The display substrate according to claim 1, further comprising a second gate metal layer arranged between the first gate metal layer and the source-drain metal layer;

wherein the shielding layer is arranged between the second gate metal layer and the source-drain metal layer.

10. The display substrate according to claim 1, wherein a material of the shielding layer is a metal material.

11. An organic light-emitting display panel, comprising the display substrate according to claim 1.

12. A display device, comprising the organic light-emitting display panel according to claim 11.

13. A display substrate, comprising:
a base substrate;
a first gate metal layer, disposed on a side of the base substrate, wherein the first gate metal layer comprises a scanning signal line;
a source-drain metal layer, disposed on a side of the first gate metal layer facing away from the base substrate, wherein the source-drain metal layer comprises a detection signal line, the detection signal line and the scanning signal line are insulated and crossed from each other, and an orthographic projection, on the base substrate, of the scanning signal line and an orthographic projection, on the base substrate, of the detection signal line have overlapping areas; and
a shielding layer, disposed between the first gate metal layer and the source-drain metal layer, wherein:
the shielding layer is insulated from the scanning signal line and the detection signal line respectively;
the shielding layer is coupled to a fixed voltage; and
the shielding layer comprises: a first shielding signal line and a second shielding signal line, an extension direction of the first shielding signal line is identical with an extension direction of scanning signal line, an extension direction of the second shielding signal line is identical with an extension direction of the detection signal line, an orthographic projection of the first shielding signal line on the base substrate covers the orthographic projection of the scanning signal line on the base substrate, and an orthographic projection of the second shielding signal line on the base substrate covers the orthographic projection of the detection signal line on the base substrate.

14. The display substrate according to claim 13, wherein the first shielding signal line and the second shielding signal line form a latticed structure comprising a plurality of meshes.

15. The display substrate according to claim 13, further comprising:
a pixel circuit electrically connected to the detection signal line and the scanning signal line; and
a light-emitting device electrically connected to the pixel circuit;
wherein the light-emitting device is a top-emitting device.

16. The display substrate according to claim 13, further comprising:
a pixel circuit electrically connected to the detection signal line and the scanning signal line; and
a light-emitting device electrically connected to the pixel circuit;
wherein the light-emitting device is a bottom-emitting device, and the orthographic projection, on the base substrate, of the shielding layer does not overlap with an orthographic projection, on the base substrate, of the light-emitting device.

17. The display substrate according to claim 13, further comprising a second gate metal layer arranged between the first gate metal layer and the source-drain metal layer;
wherein the shielding layer is arranged on a same layer as the second gate metal layer.

* * * * *